United States Patent
Yamazawa et al.

(10) Patent No.: US 6,448,094 B2
(45) Date of Patent: Sep. 10, 2002

(54) METHOD OF DETECTING ETCHING DEPTH

(75) Inventors: Yohei Yamazawa; Yoshihito Ookawa, both of Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/769,307

(22) Filed: Jan. 26, 2001

(30) Foreign Application Priority Data

Jan. 28, 2000 (JP) ........................................ 2000-019524

(51) Int. Cl.[7] ............................................. H01L 21/00
(52) U.S. Cl. ............................ 438/9; 156/345; 216/60; 216/59; 438/719; 438/735; 438/14
(58) Field of Search ........................... 438/8, 9, 14, 16, 438/719, 735; 216/59, 60, 67, 79, 84, 85; 156/345 MT

(56) References Cited

U.S. PATENT DOCUMENTS

| | | | | |
|---|---|---|---|---|
| 4,927,785 A | * | 5/1990 | Theeten et al. | 438/9 |
| 5,023,188 A | * | 6/1991 | Tanaka | 438/8 |
| 5,395,769 A | * | 3/1995 | Arienzo et al. | 438/9 X |

FOREIGN PATENT DOCUMENTS

| | | |
|---|---|---|
| JP | 2545948 | 8/1996 |
| JP | 2612089 | 2/1997 |
| JP | 10-64884 | 3/1998 |
| JP | 11-261105 | 9/1999 |

* cited by examiner

Primary Examiner—William A. Powell
(74) Attorney, Agent, or Firm—Oblon, Spivak, McClelland, Maier & Neustadt, P.C.

(57) ABSTRACT

A method of detecting an etching depth of a target object includes the steps of irradiating an etching layer of the target object that is being etched in an etching section with light having a plurality of components differing from each other in a wavelength, detecting a plurality of interference light components differing from each other in the wavelength and having an intensity periodically changed by the light components reflected from an upper surface of the etching layer and a surface of the etching section, applying a frequency analysis to these interference light components so as to obtain the frequency of each of these interference wave forms in which the intensity forms the amplitude, calculating an etching rate corresponding to each interference wave form by using the frequency of the interference wave form, and obtaining an etching depth from the etching rate.

13 Claims, 7 Drawing Sheets

METHOD OF DETECTING ETCHING DEPTH

CROSS-REFERENCE TO RELATED APPLICATIONS

This application is based upon and claims the benefit of priority from the prior Japanese Patent Application No. 2000-019524, filed Jan. 28, 2000, the entire contents of which are incorporated herein by reference.

BACKGROUND OF THE INVENTION

The present invention relates to a method and apparatus for detecting the etching depth capable of detecting the etching depth on the real time basis during the etching of a target object with plasma.

The etching method using plasma is widely employed in various fields such as the manufacturing process of a semiconductor device and the manufacturing process of an LCD substrate. The plasma etching apparatus comprises a lower electrode and an upper electrode arranged in parallel within a process chamber. For performing the plasma etching process, a target object such as a semiconductor wafer is disposed on the lower electrode. Under this condition, a plasma of an etching gas is generated by the discharge between the upper electrode and the lower electrode so as to selectively etch the target object in a predetermined pattern. During the plasma etching process, the state of etching is monitored, as required. An emission spectroscopy technique is proposed as a monitoring method. In this method, however, the time when the specified wavelength of an emission spectrum of the gas generated by the etching is changed is detected as an end point of the etching, making it impossible to know the etching depth changing with time.

A technology for detecting the etching depth is proposed in, for example, Japanese Patent No. 2545948. In this prior art, a window for observation is formed in the upper electrode, and the surface of a semiconductor wafer is irradiated with a monochromatic light such as a laser beam through the observation window from outside the process chamber. The reflected light interfered on the surface of the semiconductor wafer is detected by a detector, and the electric signal converted from the detected light in the detector is subjected to a frequency analysis of interference wave form in a wave form analyzing means by using a maximum entropy method. Then, the etching depth is calculated on the basis of the frequency distribution of the interference wave form, thereby detecting the etching depth on the real time basis. However, in the method using the interference wave form of a laser beam, a periodic distortion in a predetermined phase is unavoidable, and the etching rate is greatly deviated periodically in the distorted portion, resulting in failure to measure and monitor accurately the etching depth.

BRIEF SUMMARY OF THE INVENTION

A first object of the present invention is to provide a method of detecting an etching depth that permits suppressing the influence of the distortion even if there is a distortion of the interference wave form in a predetermined phase so as to detect accurately the etching depth.

Another object of the present invention is to provide a method of detecting an etching depth excellent in time response capability, which permits calculating the etching depth in a short time.

According to a first aspect of the present invention, there is provided a method of detecting an etching depth of a target object, comprising the steps of:

irradiating an etching layer of the target object that is being etched in an etching section with light having at least two components differing from each other in wavelength;

detecting a plurality of interference light components differing from each other in wavelength and having intensity periodically changed by the light components reflected from an upper surface of the etching layer and a surface of the etching section;

applying a frequency analysis to these interference light components so as to obtain the frequency of each of these interference wave forms in which the intensity forms the amplitude;

calculating an etching rate corresponding to each interference wave form by using the frequency of the interference wave form; and obtaining an etching depth from the etching rate.

According to a second aspect of the present invention, there is provided a method of detecting an etching depth of a target object, comprising the steps of:

irradiating an etching layer of the target object that is being etched in an etching section with a light beam;

detecting an interference light beam having an intensity periodically changed by the light beam reflected from an upper surface of the etching layer and a surface. of the etching section and having an interference wave form in which the intensity forms the amplitude;

determining an approximate formula of the interference light beam;

determining the constants of the approximate formula from the intensity of the interference light beam; and calculating an etching depth on the basis of the approximate formula, in which the constants have been determined, and the intensity of the interference light beam.

According to a third aspect of the present invention, there is provided a method of detecting an etching depth of a target object, comprising the steps of:

irradiating an etching layer of the target object that is being etched in an etching section with a light beam;

detecting an interference light beam that is periodically changed with the amplitude provided by the intensity caused by the reflected light beam from an upper surface of the etching layer and from a surface of the etching section;

estimating an amplitude of the subsequent interference wave form on the basis of a plurality of extreme values of the interference wave form having an amplitude provided by the intensity of the interference light beam;

calculating a phase on the basis of the interference intensity and amplitude at a certain time; and calculating an etching depth on the basis of the calculated phrase.

Further, according to a fourth aspect of the present invention, there is provided a method of detecting an etching depth, comprising the steps of:

continuously etching an etching section of an etching layer;

measuring an etching depth of the etching section on the real time basis so as to output a corresponding information;

comparing the output information with an information corresponding to an etching depth set in advance on the real time basis; and stopping the step of etching when the output information has been found in the comparing step to be equal to the information corresponding to the etching depth set in advance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
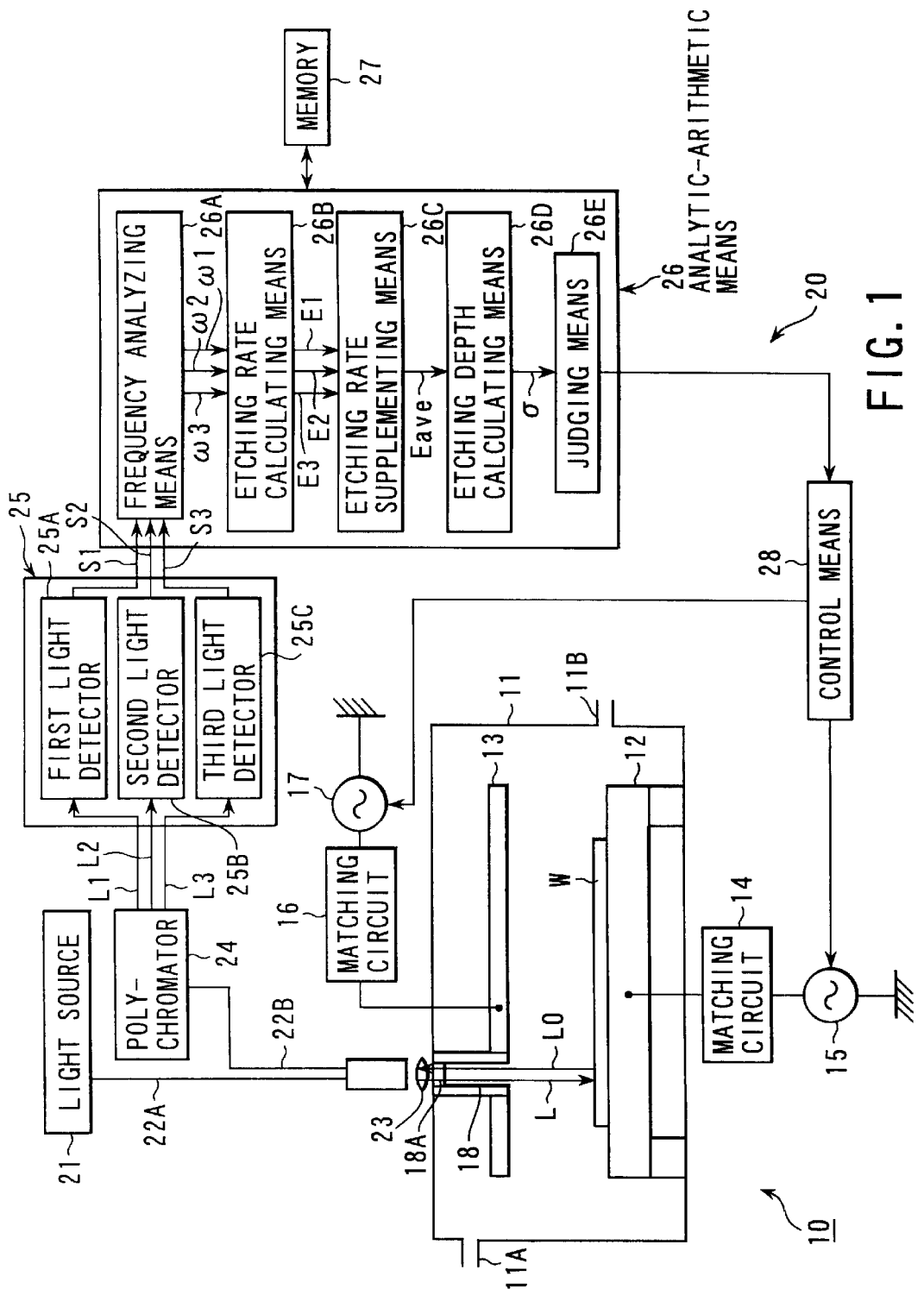
FIG. 1 is a view for schematically showing as an example an etching apparatus for working an etching depth detecting method of the present invention.

An etching depth detecting method according to one embodiment of the present invention will now be described with reference to FIGS. 1 to 8.

First of all, an example of an etching apparatus 10 for working the etching depth detecting method of the present invention will now be described with reference to FIG. 1. As shown in the figures, the etching apparatus 10 comprises a process chamber 11 made of a conductive material such as aluminum, a lower electrode 12 that also acts as a susceptor on which a semiconductor wafer W, which is an example of a target object to be processed, is disposed, and an upper electrode 13 arranged a predetermined distance above the lower electrode 12. A gas supply port 11A connected to a gas supply source (not shown) is formed in an upper portion of the circumferential wall of the process chamber 11. Also, a gas exhaust port 11B connected to a vacuum exhaust apparatus (not shown) is formed in a lower portion of the circumferential side wall of the process chamber 11. A high frequency power source 15 is electrically connected to the lower electrode 12 via a matching circuit 14. Further, another high frequency power source 17 is connected to the upper electrode 13 via a matching circuit 16. A high frequency power having a frequency higher than that of the high frequency power supplied from the high frequency power source 15 to the lower electrode 12 is supplied from the high frequency power source 17 to the upper electrode 13.

For performing the etching process, the inner space of the process chamber 11 is evacuated through the gas exhaust port 11B by the vacuum exhaust apparatus so as to set up a predetermined degree of vacuum within the process chamber 11. Then, an etching gas is supplied through the gas supply port 11A into the process chamber 11 with the high frequency powers applied to the lower and upper electrodes 12 and 13. As a result, a plasma of the etching gas is generated between the both electrodes 12 and 13. Thus, as shown in, for example, FIG. 2, an etching section E' of an etching layer E, i.e., an upper portion of the wafer W, is etched through an open portion O of a resist layer R formed on the upper surface of the semiconductor wafer W so as to form a groove or a hole T having a predetermined depth.

A cylindrical window supporting member 18 for the monitoring purpose is provided to extend vertically through the upper wall of the process chamber 11. A monitoring window 18A made of a transparent material such as quartz glass is mounted to close the upper opening of the window supporting member 18. The lower open end portion of the window supporting member 18 extends through the upper electrode 13 so as to face the upper surface of the semiconductor wafer W with a predetermined distance provided therebetween. An etching monitoring apparatus 20 for monitoring an etching state of the semiconductor wafer W within the process chamber 11 is connected to the window supporting member 18. As shown in FIG. 1, the etching monitoring apparatus 20 comprises a light source 21, an optical fiber 22A having one end connected to the light source 21, a focusing lens 23 arranged between the other end of the optical fiber 22A and the window 18A, a polychromator 24 having the input side connected to one end portion of an optical fiber 22B having the other one end positioned to face the window 18A, a light detector 25 connected to the output side of the polychromator 24, an analytical-arithmetic circuit or means 26 connected to the output side of the light detector 25, and a memory 27 connected to the analytical-arithmetic means 26. A control device 28 is electrically connected to the output side of the analytical-arithmetic means 26. The output side of the controller 28 is connected to the high frequency power sources 15 and 17. As described herein later, when the analytical-arithmetic means 26 has calculated that the target etching depth has been achieved, the control device 28 stops the operations of the high frequency power sources 15 and 17 so as to finish the etching process.

Figure 2:
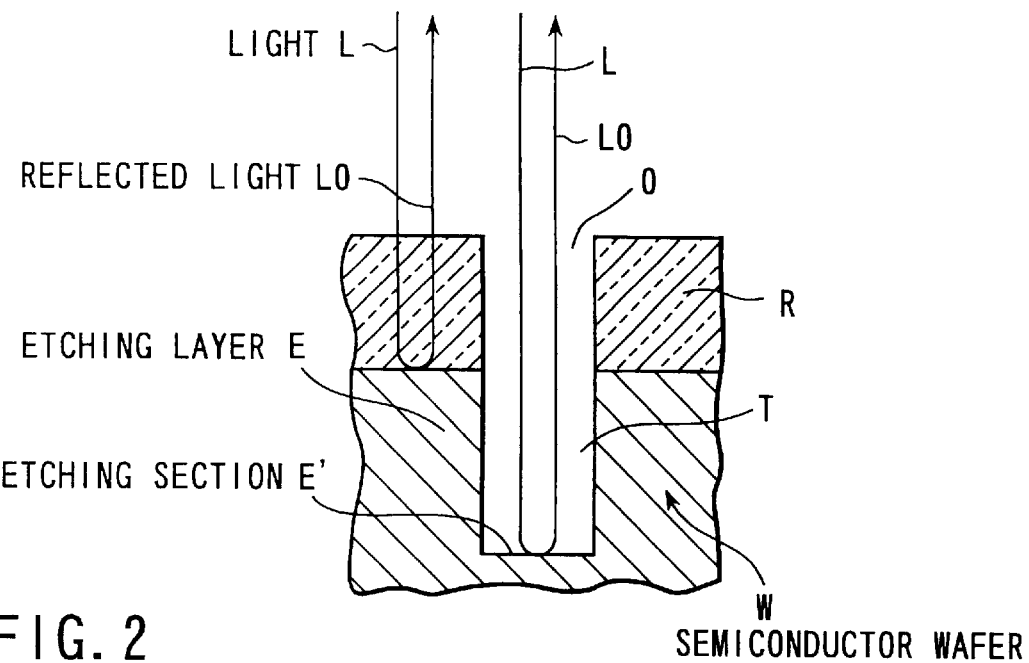
FIG. 2 is a view for showing the interference light components in etching a semiconductor wafer.
Figure 3:
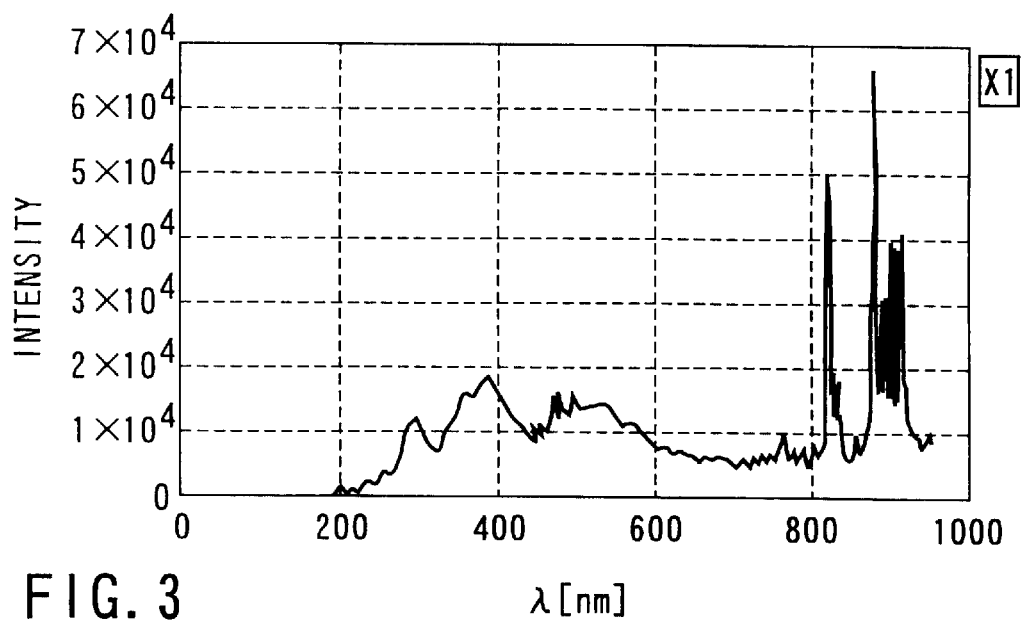
FIG. 3 is a view for showing a spectrum of the reflected light from a semiconductor wafer disposed within the etching apparatus shown in FIG. 1.

If light having a spectrum of a wavelength region shown in, for example, FIG. 3 is emitted during the etching process from the light source 21 formed of, for example, a xenon lamp, the emitted light L passes through the optical fiber 22A, the lens 23 and the window supporting member 18 so as to be incident on the etching section E' of the semiconductor wafer W and on the resist layer R within the process chamber 11. As a result, light L is reflected from the interface between the resist layer R and the etching layer E and from the upper surface of the etching section E', as shown in FIG. 2. The reflected light beams or components $L_0$ are caused to interfere each other so as to generate an interference light. As shown in FIG. 1, the reflected light beams or components $L_0$ pass through the window supporting member 18, the lens 23 and the optical fiber 22B so as to be incident on the polychromator 24 and, thus, split into a plurality of interference light components having different wavelengths. Among the split light components, the interference light components $L_1$, $L_2$, and $L_3$ having the wavelengths $\lambda$ of 350 nm, 450 nm and 550 nm, respectively, are supplied to the light detector 25. In the light detector 25, the intensities of these interference light components are detected by first, second and third light detectors 25A, 25B and 25C, respectively. In these light detectors 25A, 25B and 25C, the interference light components of the wavelengths noted above are converted into electric signals so as to output three kinds of analog signals $S_1$, $S_2$ and $S_3$ corresponding to the intensities of the converted: electric signals. These analog signals are amplified, in amplifiers (not shown) and, then, converted into digital signals in A/D converters (not shown). The resultant digital signals are supplied to the analytic-arithmetic means or circuit 26. As described herein later, the etching depth is obtained in the analytic-arithmetic means 26 on the basis of these digital signals.

Since the etching section E' is gradually deepened by the progress of the etching, the intensity of each interference light component is periodically changed with the etching time in accordance with the change in the etching depth so as to form an interference wave form. These interference wave forms are presented theoretically as a sine wave represented by formula (1) given below and, thus, are changed with time:

$$I=I_{dc}+I_{pp} \sin(\omega t) \tag{1}$$

The relationship between the frequency $\omega$ and the etching depth in formula (1) can be theoretically represented by formula (2) given below:

$$\omega=2\pi d(n\delta/\lambda)/dt \tag{2}$$

In each of formulas (1) and (2), $I_{dc}$ represents an amplitude of the DC component of the interference wave form, $I_{pp}$ represents an amplitude of the AC component of the interference wave form, $\omega$ represents the angular frequency (hereinafter referred to simply as "frequency") of the interference wave form, n represents a refractive index of the etching layer E, $\delta$ represents an etching depth of the etching section E', and $\lambda$ represents the wavelength of the light used for the measurement.

As shown in FIG. 1, the analytic-arithmetic means 26 comprises a frequency analyzing means or circuit 26A connected to the output side of the light detector 25 for analyzing the frequency of the interference light by using the maximum entropy method or the Fast Fourier transform, an etching rate calculating means or circuit 26B for calculating an etching rate of each interference wave form on the basis of the frequency $\omega$ obtained in the frequency analyzing means 26A, an etching rate supplementing means or circuit 26C for mutually supplementing the etching rate obtained in the etching rate calculating means 26B so as to calculate the practical etching rate, an etching depth calculating means or circuit 26D for calculating the etching depth on the basis of the etching rate obtained in the etching rate supplementing means 26C, and a judging means or circuit 26E for judging the etching depth obtained in the etching depth calculating means 26D. Stored in the memory 27 connected to the analytic-arithmetic means 26 are, for example, a program relating to the maximum entropy method and the Fast Fourier transform, a program used for calculating the etching rate and the etching depth, and data of the interference wave forms.

In the frequency analyzing means 26A of the analytic-arithmetic means 26, the frequencies of the three kinds of the interference light components are analyzed by using the maximum entropy method or the Fast Fourier transform (the maximum entropy method being used in this embodiment) so as to obtain the frequency $\omega(t)$ and the phase p(t) from, for example, the time (t−$\Delta$t) to the time t for each of the interference wave forms. The frequency is obtained for every $\Delta$t.

Since there is the relationship denoted by formula (3) given below between the etching rate E(t) and the frequency $\omega(t)$, the frequency $\omega(t)$ from the time (t−$\Delta$t) to the time t is obtained in accordance with the program for each of the interference wave forms in the etching rate calculating means 26B. From the relationship between the frequency $\omega(t)$ and the etching rate, the etching rate E(t) meeting each of the interference wave forms at that time is calculated on the basis of formula (3) for every $\Delta$t:

$$E(t)=d\delta(t)/dt=\omega(t)\lambda/(2\pi n) \tag{3}$$

It is known to the art that the actually observed interference wave form is distorted by various factors. However, where the time width $\Delta$t used for the frequency analysis is long to some extent (i.e., more than one period; $\Delta$t>$2\pi/\omega$), the influence of the distortion is averaged, with the result that a practically large influence is not given to the obtained signal. On the other hand, in order to improve the capability of the etching rate to follow the change in time, i.e., a time response capability, it is necessary to diminish $\Delta$t as much as possible. If $\Delta$t is longer than the half period of the interference wave form that is being observed ($\Delta$t>$\pi/\omega$), it is possible to analyze the interference light component by any of the maximum entropy method or the high speed Fourier transform method. However, if $\Delta$t is short, the etching rate is affected by the distortion of the interference wave form, with the result that the etching rate is decreased by,, for example, about 20% in the case where the phase p exactly corresponds to $\pi/2$ in the sine wave, and the etching rate is increased by about 20% in the case where the phase p corresponds to $3\pi/2$.

As described above, the interference wave forms have distortions at predetermined phases ($\pi/2$, $3\pi/2$, ... m$\pi/2$, m being an odd number), and the etching rate is deviated from the original etching rate in each of these phases. The time when the interference wave form has a distortion differs depending on the interference wave form if the wavelength differs. Therefore, the etching rate is obtained for each of a plurality of kinds of interference wave forms differing from each other in the: wavelength and, at the same time, the phase p is obtained for each of these interference wave forms. It should be noted that, by selecting the wavelength of the interference wave form such that, at the phase at which one of the three interference wave forms has a distortion, the other two interference wave forms do not have a distortion, the etching rate obtained from the former interference wave form is supplemented by the etching rate obtained from the latter interference wave forms. In the etching rate supplementing means 26C, the weighting of $\cos^2(p_i(t))$ relative to the phase $p_i(t)$ is applied in the program to the calculated etching rate $E_i(t)$ obtained at time t relative to the i-th wavelength $\lambda_i$ and the average etching rate $E_{ave}(t)$ of the weighted etching rate is obtained by formula (4) given below. By this process, the value of $\cos^2(p_i(t))$ is allowed to approach zero in the vicinity of the phases ($p=\pi/2$, $3\pi/2$, . . . ) at which the wave forms are distorted, and the weight of the data of the wave form that is not distorted is rendered relatively large. As a result, the deviations of the etching rate accompanying the mutual distortion are automatically supplemented each other, making it possible to obtain the average etching rate $E_{ave}$ as a value close to the original etching rate. It should be noted, however, that, during the etching time, it is necessary to continue to select the wavelength that permits the denominator of formula (4), i.e., $\Sigma\cos^2(p_i(t))$, not to be zero, i.e., $\Sigma\cos^2(p_i(t)) \neq 0$.

$$E_{ave}(t) = [\Sigma E_i(t)\cos^2(p_i(t))]/\Sigma\cos^2(p_i(t)) \quad (4)$$

In the etching depth calculating means 26D, the etching depth $\delta(t)$ is calculated for every $\Delta t$ by integrating with time the average etching rate $E_{ave}$ as denoted by formula (5) given below:

$$\delta(t) = \int E_{ave}(t) dt \quad (5)$$

In the judging means 26E, it is judged whether or not the etching depth $\delta(t)$ has reached a target etching depth by comparing the etching depth $\delta(t)$ with the target etching depth set in advance. If the target etching depth has not been reached, a series of operations described above are repeated until the target etching depth is reached.

Figure 4:
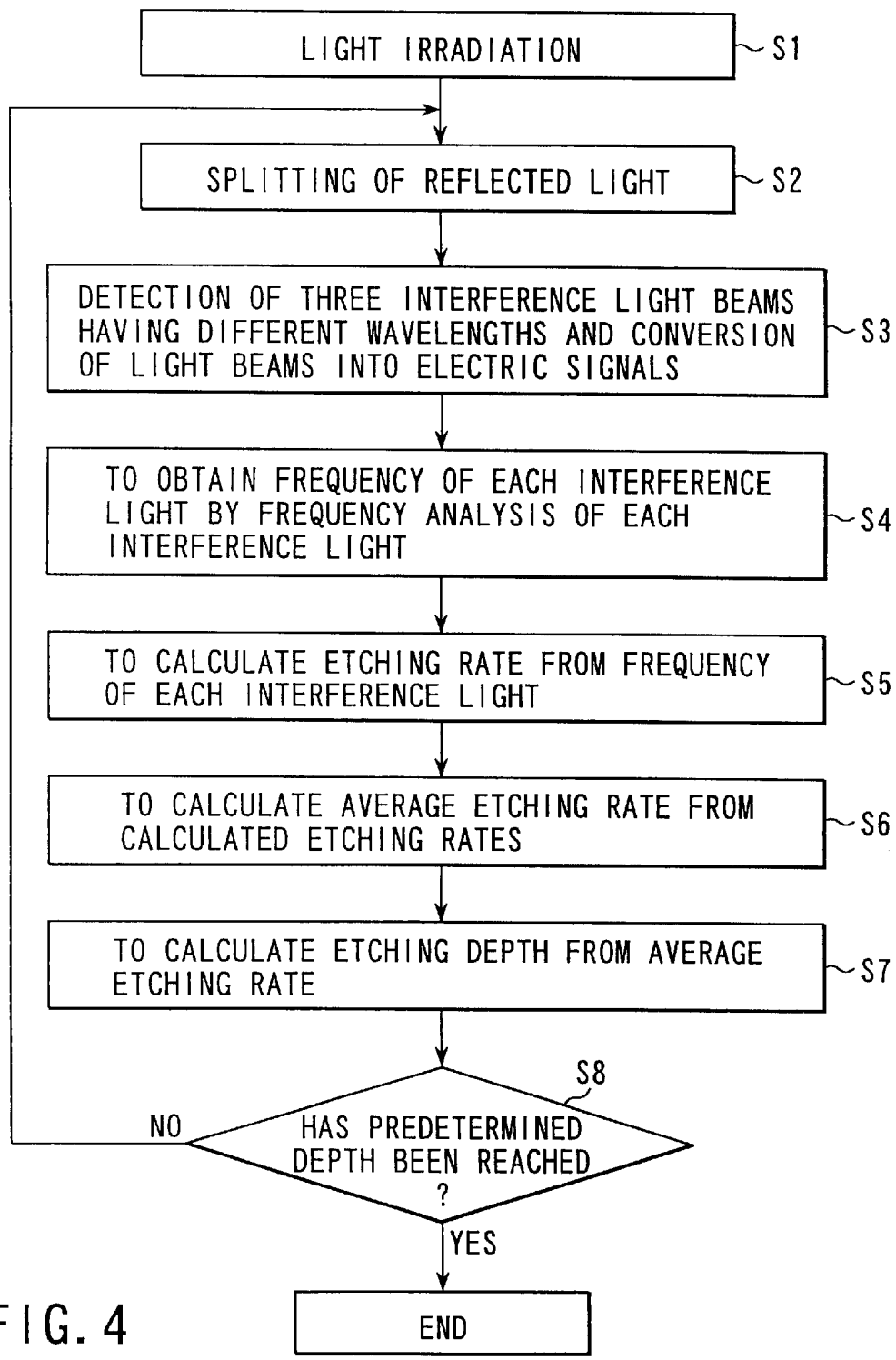
FIG. 4 is a flow chart showing a procedure of a method according to one embodiment of the present invention for detecting an etching depth by using the etching apparatus shown in FIG. 1.

To be more specific, the etching depth detecting method in this embodiment will now be described with reference to FIG. 4. If the semiconductor wafer W within the process chamber 11 of the etching apparatus begins to be etched, the etching monitoring apparatus is operated, preferably, automatically. For example, the etching monitoring apparatus is operated automatically, if the high frequency power sources 15 and 17 are interlocked with an ON-OFF switch of the etching monitoring apparatus 20. If the etching monitoring apparatus 20 is operated, the surface of the semiconductor wafer W is irradiated in a vertical direction with a radiation light L emitted from the light source 21 and transmitted through the optical fiber 22A (step S1). The radiated light L is reflected from the upper surface of the etching layer E and the upper surfaces of the other portions. The reflected light beams or components $L_0$, i.e., the light beams reflected from the upper surface of the etching layer E and from the upper surface of the etching section E', pass through the optical fiber 22B while interfering with each other so as to reach the polychromator 24 so as to be split into interference light beams or components $L_1$, $L_2$ and $L_3$ having wavelengths of 350 nm, 450 nm and 550 nm, respectively (step S2). Then, the intensities of the interference light beams are detected in the first, second and third light detectors 25A, 25B and 25C, respectively, and the interference light beams $L_1$, $L_2$ and $L_3$ are converted into electric signals in the light detectors 25A, 25B and 25C, respectively (step S3). Further, interference intensity signals $S_1$, $S_2$ and $S_3$ corresponding to the interference light beams $L_1$, $L_2$ and $L_3$, respectively, are supplied through the amplifier (not shown) and the A/D converter (not shown) to the frequency analyzing means 26A of the analytic-arithmetic means 26.

In the frequency analyzing means 26A, the frequencies of the interference intensity signals $S_1$, $S_2$ and $S_3$ are analyzed by using the maximum entropy method or the Fast Fourier transform method so as to obtain the frequencies $\omega_1(t)$, $\omega_2(t)$, $\omega_3(t)$ and the phases $p_1(t)$, $p_2(t)$ and $p_3(t)$, in the range of Time (t) from Time (t–$\Delta t$) (step S4). It should be noted that the time width $\Delta t$ is set to constitute the half period of each of the interference wave forms. The frequency analyzing means 26A outputs the frequency signals $\omega_1$, $\omega_2$, and $\omega_3$ to the etching rate calculating means 26B. In the etching rate calculating means 26B, signals $E_1(t)$, $E_2(t)$ and $E_3(t)$ denoting the etching rates corresponding to the interference wave forms are calculated on the basis of formula (3) given previously by using these frequency signals (step S5). When the etching rate calculating means 26B has supplied these etching rate signals $E_1$, $E_2$ and $E_3$ to the etching rate supplementing means 26C, a signal $E_{ave}(t)$ denoting the average value, of the etching rates is calculated in the etching rate supplementing means 26C on the basis of formula (4) given previously by using these calculated etching rate signals (step S6). The etching rate supplementing means 26C supplies the average etching rate signal $E_{ave}$ to the etching depth calculating means 26D. Then, the etching depth calculating means 26D calculates the etching depth on the basis of formula (5) given previously by using the average etching rate signal and supplies a signal denoting the calculated etching depth to the judging means 26E (step S7). In the judging means 26E, it is judged on the basis of the etching depth signal whether or not the etching depth $\delta(t)$ has reached the target depth (step S8). If the target depth has not yet been reached, the operations of steps S2 to S8 described above are repeated. If the target depth has been reached, however, the high frequency power sources 15 and 17 are turned off via the control device 28 so as to finish the etching process.

Figure 5:
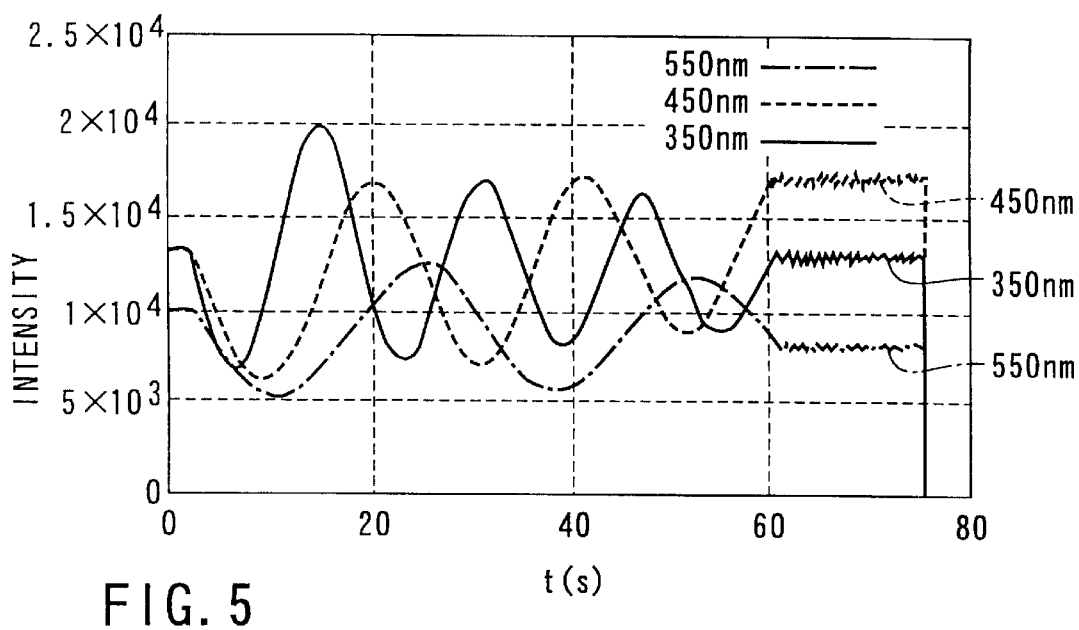
FIG. 5 is a view for showing the actually measured wave forms denoting interference signals of wave forms of three kinds of interference light components obtained by reflected light from an etching section and an upper surface of an etching layer in the case of using the etching apparatus shown in FIG. 1.
Figure 6:
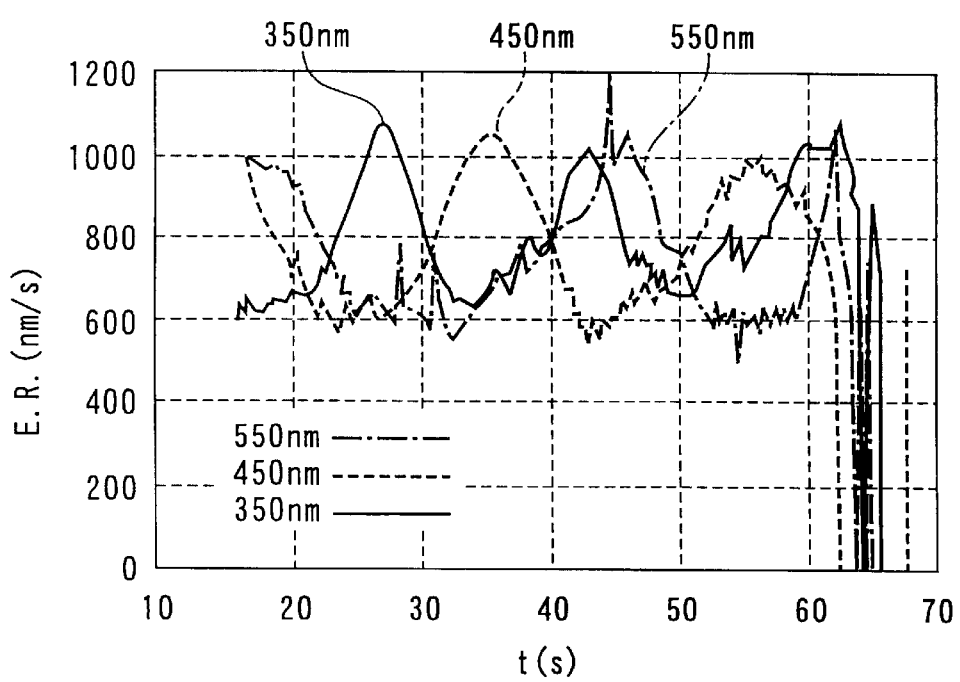
FIG. 6 is a graph showing etching rates (nm/sec) obtained individually from the interference wave forms having wavelengths of 350 nm, 450 nm and 550 nm shown in FIG. 5.
Figure 7:
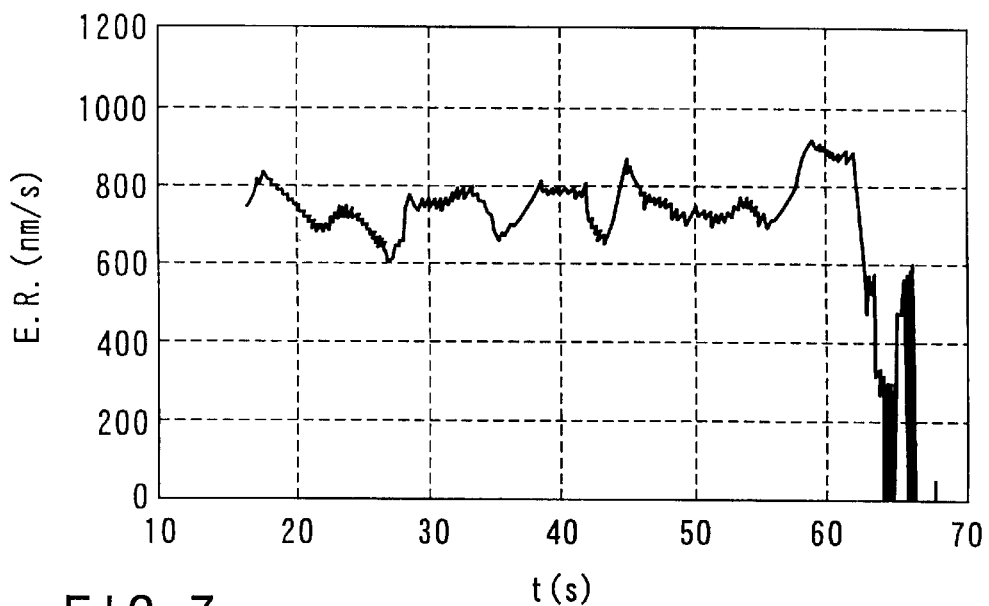
FIG. 7 is a graph showing the etching rates obtained by mutually supplementing and weighting the etching rates of the interference wave forms of the interference light components having the wavelengths of 350 nm, 450 nm and 550 nm shown in FIG. 6.
Figure 8:
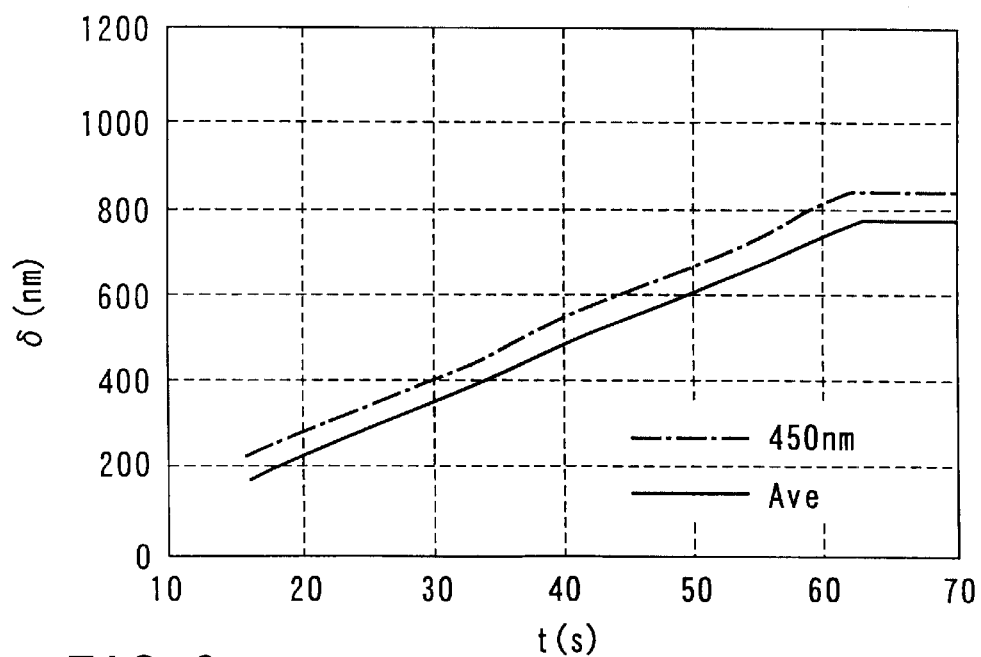
FIG. 8 is a graph showing an etching depth obtained by using a single wavelength of 450 nm at each of the times shown in FIG. 7, wherein dot-and-dash line denotes the etching depth obtained from the etching rate shown in FIG. 6, and a solid line denotes the etching depth obtained from the etching rate shown in FIG. 7.

FIGS. 5 to 8 show the results of the series of operations described above. Specifically, FIG. 5 is a graph showing the interference wave forms having wavelengths of 350 nm, 450 nm and 550 nm. Plotted on the abscissa of the graph is the time (seconds), with the intensities of the interference waves (dimensionless number) being plotted on the ordinate. In the graph of FIG. 5, the interference wave forms do not seem to be distorted at the phases $\pi/2$ and $3\pi/2$. However, the distortion can be recognized if a wave form analysis is applied. FIG. 6 is a graph showing an etching rate E.R. (nm/sec) at each time, which was obtained individually from the interference waves having the wavelengths of 350 nm, 450 nm and 550 nm, respectively, by using formula (3) described previously. FIG. 7 is a graph showing the etching rate at each time obtained by mutually supplementing and weighting the etching rates of the interference wave forms of the interference waves having the wavelengths of 350 nm, 450 nm and 550 nm, respectively. The etching rate was obtained by using the formula (4) described previously. Further, FIG. 8 shows a relationship between time (seconds) and the etching depth (nm). The dot-and-dash line shown in FIG. 8 denotes the etching depth obtained from the interference light having a single wavelength of 450 nm at each time obtained on the basis of formula (3) given previously. On the other hand, the solid line shown in FIG. 8 denotes the etching depth obtained from interference light beams having three wavelengths at each time obtained on the basis of formula (4) given previously.

FIG. 6 shows that, in the case of the calculated etching rates of $E_1(t)$, $E_2(t)$ and $E_3(t)$ obtained from the three kinds of interference wave forms, which must originally be a constant etching rate, each of these etching rates is deviated by about ±200 nm/sec about 800 nm/sec. However, the graph of FIG. 7 shows that, when it comes to the average etching rate $E_{ave}$ obtained by mutually supplementing the calculated etching rates by weighting the three kinds of the calculated etching rates, the error in the etching rate is suppressed to about ±80 nm/sec, supporting that the error in the etching rate is markedly improved compared with the case of using a single wavelength. On the other hand, the graph of FIG. 8 shows that an etching depth δ obtained on the basis of the average etching rate $E_{ave}$ in which the three kinds of the wavelengths are supplemented with each other is linearly changed with time to form an inclined straight line. However, in the case of the single wavelength, the inclination of the graph is waved under an influence given by an error in the etching rate.

As described above, according to this embodiment, the semiconductor wafer W is irradiated with light having at least three components differing from each other in the wavelength, and the reflected light beams $L_0$ reflected from the interface between the resist layer R and the etching layer E, i.e., reflected from the upper surface of the etching layer E, and from the surface of the etching section E' are allowed to be incident on the polychrometer 24. In the light detector 25, the three kinds of the interference light beams $L_1$, $L_2$ and $L_3$, which differ from each other in the wavelength., of the reflected light $L_0$ that is periodically changed are detected in the first, second and third light detectors 25A, 25B and 25C, respectively. Then, the frequencies $\omega_1(t)$, $\omega_2(t)$ and $\omega_3(t)$ of the interference wave forms are obtained by analyzing the frequencies of the interference light beams $L_1$, $L_2$ and $L_3$. Further, the etching rates conforming with the interference wave forms are obtained as the calculated etching rates $E_1(t)$, $E_2(t)$ and $E_3(t)$ on the basis of these frequencies, followed by obtaining the average etching rate $E_{ave}$ of the three kinds of the interference wave forms by weighting these calculated etching rates on the basis of the phases $p_1(t)$, $p_2(t)$ and $p_3(t)$ of the interference wave forms. Finally, the etching depth δ(t) is calculated by integrating the average etching rate $E_{ave}$. It should be noted that, even if a single interference wave form corresponds to a specified phase mπ/2 (m being an odd number), e.g., π/2, at a certain time so as to be distorted, the other interference wave forms do not correspond to the phase of π/2, with the result that it is possible to suppress the influence of the distortion of the former one interference wave form at π/2 by supplementing the former one etching rate by the latter two calculated etching rates. It follows that it is possible to detect accurately the etching depth.

When the etching rate is calculated in this embodiment, the etching rates are obtained as the calculated etching rates $E_1(t)$, $E_2(t)$ and $E_3(t)$ on the basis of the frequencies $\omega_1(t)$, $\omega_2(t)$ and $\omega_3(t)$ of the three kinds of the interference wave forms, and the average etching rate $E_{ave}$, in which the deviation of the calculated etching rate based on the distortion of any of the interference wave form is supplemented by the calculated etching rates based on the other interference wave forms that are not distorted, is obtained as the etching rate. It follows that, even if any of the interference wave forms is distorted, it is possible to obtain the etching rate in which the influence of the distortion is suppressed. It should also be noted that, for supplementing the deviation of the calculated etching rate based on the distortion of any of the interference wave forms with the calculated etching rate based on the other interference wave forms that are not distorted, the phases $p_1(t)$, $p_2(t)$ and $p_3(t)$ of the three kinds of the interference wave forms are also obtained in analyzing the frequencies, and the average etching rate $E_{ave}(t)$, in which the calculated etching rates $E_1(t)$, $E_2(t)$ and $E_3(t)$ are averaged with $\cos^2(p_i(t))$ in accordance with the phases of these interference wave forms so as to obtain the weighted average, is obtained as the etching rate. It follows that it is possible to suppress without fail the influence of the distortion at each of π/2, 3π/2, . . . mπ/2 at which distortion of each interference wave form appears. In obtaining the weighted average, the interference wave form is selected such that the wavelengths of the three kinds of the interference wave forms are prevented from becoming mπ/2 (m being an odd number) simultaneously. Therefore, it is possible to supplement without fail the deviation of the calculated etching rate based on the deviation of any of the interference wave forms with the calculated etching rate based on the other interference wave forms that are not distorted.

Figure 9:
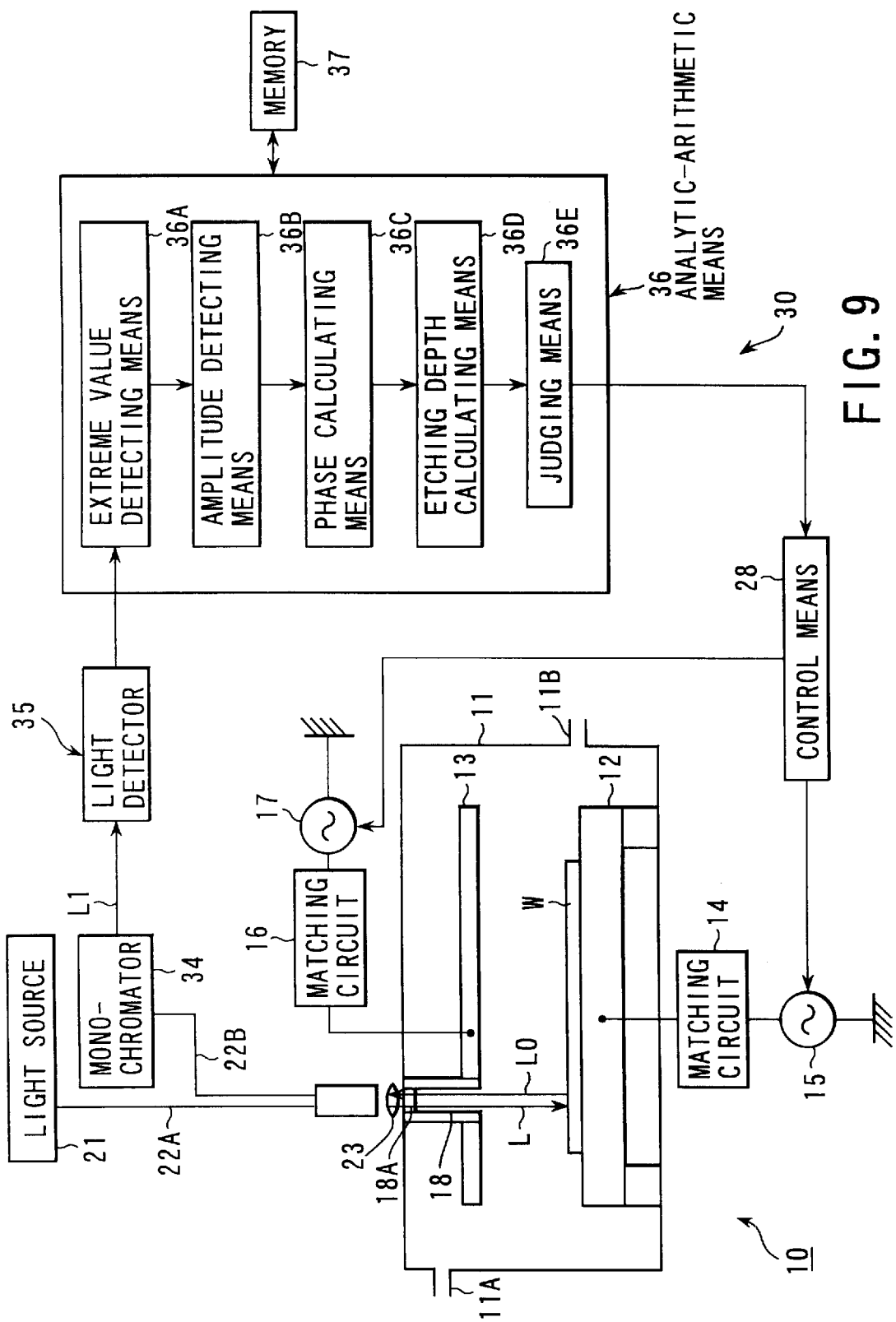
FIG. 9 is a view for schematically showing as another example an etching apparatus for working an etching method according to another embodiment of the present invention.

FIG. 9 shows as an example the construction of an etching apparatus 10 used for working the etching depth detecting method according to another embodiment of the present invention.

As shown in FIG. 9, the etching apparatus 10 in this embodiment comprises a process chamber 11 of a semiconductor wafer W and an etching monitoring apparatus 30 for monitoring the etching state of the semiconductor wafer W within the process chamber 11, and is constructed to conform with the etching apparatus 10 shown in FIG. 1 except the etching monitoring apparatus 30. Therefore, the etching monitoring apparatus 30 is described mainly in respect of the etching apparatus 10 shown in FIG. 9.

The etching monitoring apparatus 30 combined with the etching apparatus 10 shown in FIG. 9 comprises a light source 21, optical fibers 22A, 22B, a lens 23, a monochromator 34, a light detector 35, an analytic-arithmetic means or circuit 36 and a memory 37. In this embodiment, the surface of the semiconductor wafer W arranged within the process chamber 11 is irradiated with a radiated light L emitted from the light source 21 and a light $L_0$ reflected from the surface of the semiconductor wafer W is detected so as to monitor on the real time basis the etching state on the basis of a single light beam $L_1$. When the etching depth has reached a predetermined value, the etching is stopped via a control device 28.

The analytic-arithmetic means 36 comprises a extreme value detecting means or circuit 36A for detecting a continuous maximal value and a minimal value of the interference wave form of the interference light beam $L_1$, an amplitude estimating means 36B for estimating an amplitude of the subsequent interference wave form on the basis of the maximal and minimal values of the interference wave form detected by the extreme value detecting means 36A, a phase calculating means or circuit 36C for calculating a phase of the interference wave form on the basis of a ratio of an intensity of the interference wave form at a certain time to the estimated amplitude, an etching depth calculating means or circuit 36D for calculating an etching depth on the basis of the phase obtained by the phase calculating means 36C, and a judging means or circuit 36E for judging an etching depth obtained by the etching depth calculating means 36D.

The basic idea of this embodiment will now be described.

As described previously, the interference wave form is periodically varied as denoted by formula (1) given previously. However, the interference light beam is affected by the influence of the light emission of the plasma for the etching. In addition, the reflectance and the transmittance of the interference light beam are dependent on the etching depth. As a result, the amplitude of the interference light beam is gradually attenuated as shown in FIG. 5. Such being the situation, the interference wave form is represented by formula (1) given previously and having the attenuation rate exp(γt) taken into consideration, i.e., an approximate formula (6) given below:

$$I = I_{dc} + I_{pp} \exp(\gamma t) \sin(\omega t) \quad (6)$$

where each of $I_{dc}$, $I_{pp}$ and $\gamma$ is a constant (damping rate; a constant of the approximate formula (6) of an envelope passing through extreme values of the periodical variation).

In the extreme value detecting means 36A, the maximal and the minimal values of the interference wave form intensity are detected at the points where the actual phase (p=ωt) of the interference wave form becomes π/2, 3π/2, 5π/2, . . . mπ/2 (m being an odd number). Strictly speaking, these values are not the extreme values. However, in the observed interference wave form, the frequency ω is experimentally markedly larger than γ and, thus, these values can be regarded approximately as the extreme values. The constants $I_{dc}$, $I_{pp}$, and $\gamma$ are also changed with time, though the change is moderate, compared with the change in ω. Such being the situation, three approximate extreme values $I_1$, $I_2$ and $I_3$ are consecutively detected at time $t_1$, $t_2$, and $t_3$, and signals denoting these extreme values $I_1$, $I_2$ and $I_3$ are supplied to the amplitude estimating means 36B. These extreme values are denoted by a mark "x" in FIG. 10.

In the amplitude estimating means 36B, an envelope passing through the three extreme values is determined on the basis of the approximate formula (6) from the three extreme values $I_1$, $I_2$ and $I_3$ of the consecutive interference intensity supplied from the extreme value detecting means 36A by using a dichotomy, which is a numeral analytical method. Then, the constants $I_{dc}$, $I_{pp}$ and $\gamma$ in the approximate formula (6) are obtained on the basis of the three extreme values $I_1$, $I_2$ and $I_3$ of the envelope and, then, the approximate formula (6), in which the constants noted above have been determined, is determined and supplied to the phase calculating means 36C.

In the phase calculating means 36C, the intensity I(t) of the interference wave form at time (t) is detected by using the constants $I_{dc}$, $I_{pp}$ and $\gamma$ determined in;the amplitude estimating means 26B, and based on the intensity I(t) thus detected, it is possible to obtain the phase p(t) at time (t) from formula (7) given below, which is obtained by transforming formula (6). The phase signal is then supplied to the etching depth calculating means 36D.

$$p(t) = \text{Arcsin}[(I(t) - I_{dc})/(I_{pp} \exp(\gamma t))] \quad (7)$$

Figure 11:
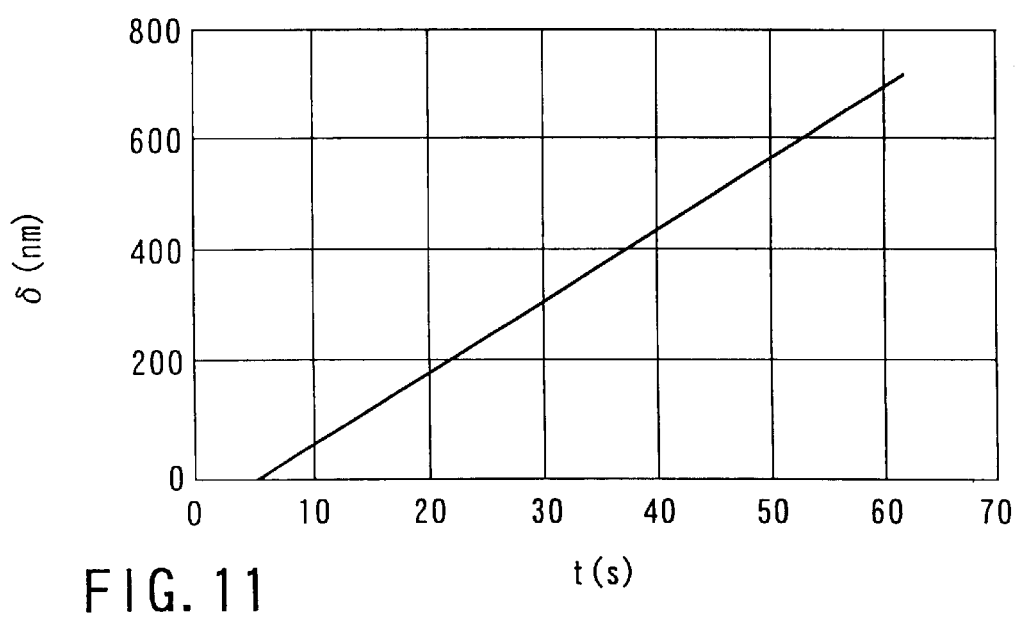
FIG. 11 is a graph showing an etching depth obtained on the basis of the estimated graph of FIG. 10.

In the etching depth calculating means 36D, the etching depth δ(t) at time (t), which is obtained in the phase calculating means 36C, is obtained from formula (8) given below, which represents the relationship between the phase p(t) and the etching depth δ(t). FIG. 11 is a graph showing the relationship between the etching depth δ(t) and time thus obtained. As apparent from FIG. 11, the graph showing the change with time in the etching depth is not curved but is straight, supporting a constant etching rate.

$$\delta(t) = p(t) \lambda/(2\pi n) \quad (8)$$

The constants $I_{dc}$, $I_{pp}$ and $\gamma$ referred to previously can be obtained by the least-squares method by using many points. In the case of the approximate formula (6) thus obtained, however, the interference wave form (I=$I_{dc}$+$I_{pp}$exp(γt)sin(ωt)) does not necessarily pass through all the extreme values, and the value of the phase p(t) in the vicinity of the extreme value is rendered highly inaccurate. However, where the constants $I_{dc}$, $I_{pp}$ and γ are obtained from the three extreme values as in this embodiment, the interference wave form passes through all the extreme values without fail so as to ensure a high accuracy of the interference wave form.

Figure 10:
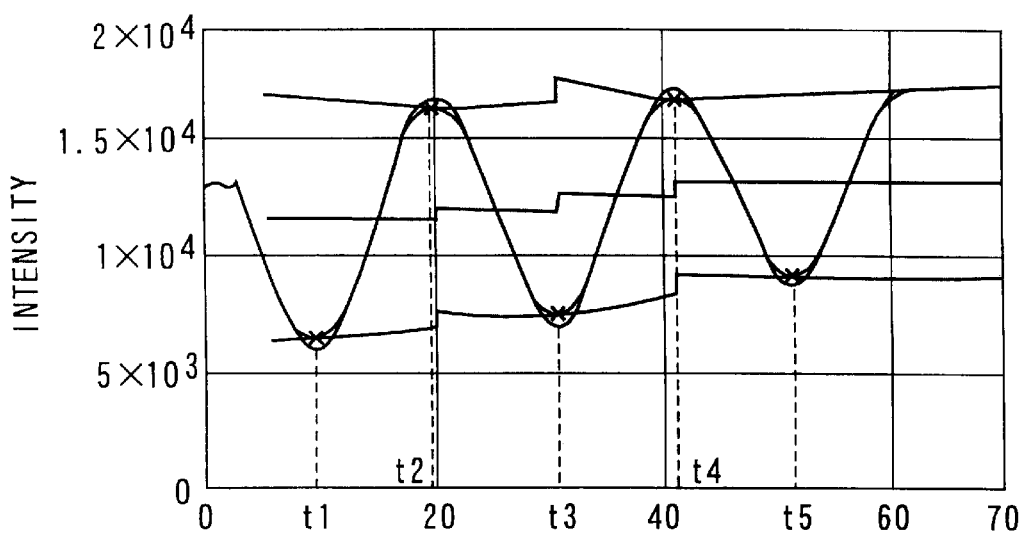
FIG. 10 is a graph showing a change with time in the amplitude of the interference wave form estimated by using the etching apparatus shown in FIG. 9.

The etching depth detecting method in this embodiment will now be described more in detail in conjunction with FIGS. 10 and 11. If a signal of an interference light beam is supplied through the monochromator 34 and the light detector 35 into the analytic-arithmetic means 36, the extreme values of the interference intensity are detected with time in the extreme valuedetecting means 36A. For example, the extreme values $I_1$, $I_2$ and $I_3$ of the interference intensity are successively detected at time $t_1$, $t_2$ and $t_3$ in the extreme value detecting means 36A as shown in FIG. 10. In the amplitude estimating means 36B, an envelope passing through three consecutive points is determined from approximate formula (6) on the basis of these interference intensities by a dichotomy, which is a numeral analytical method, followed by determining the constants $I_{dc}$, $I_{pp}$ and γ of the envelope. These constants are determined as the constants of approximate formula (6) so as to determine approximate formula (6). In the next period between time $t_3$ and time $t_4$, it is possible to obtain successively the etching depths between time $t_3$ and time $t_4$ from the approximate formula, in which the constants have been determined, and the interference intensity at that time from formulas (7) and (8). At time $t_4$ when the next extreme value appears, the constants at that time and approximate formula (6) are determined as above from the three consecutive extreme values $I_2$, $I_3$ and $I_4$ including the extreme value $I_4$ of the interference intensity at this time by using a dichotomy. Further, the etching depth between time $t_4$ and time $t_5$ can be obtained from the newly determined approximate formula and the extreme value of the interference intensity between time $t_4$ and time $t_5$. Similar procedures are repeated until the etching is finished, and at the time when a predetermined etching depth has been finally reached, the high frequency power sources 15 and 17 are turned off via the control device 28 so as to finish the etching process.

As described above, the etching depth detecting method according to this embodiment comprises the steps of irradiating the semiconductor wafer W with light L, detecting the interference light beam $L_1$, which is periodically changed, caused by light beams $L_0$ reflected from the upper surface of the etching layer E and the surface of the etching section E', determining approximate formula (6) of the interference light beam $L_1$, determining the constants $I_{dc}$, $I_{pp}$ and γ included in approximate formula (6) from the intensity of the interference light beam, and calculating the etching depth δ(t) based on approximate formula (6), in which the constants $I_{dc}$, $I_{pp}$ and γ have been determined, and the extreme values $I_1$, $I_2$ and $I_3$ of the interference light intensity. What should be noted is that, in the present invention, the etching depth can be obtained by calculation in a short time with a small amount of calculation, if at least three extreme values are detected. In short, the etching depth detecting method of the present invention is excellent in the response capability to time.

In determining the constants of the approximate formula, an envelope of approximate formula (6) is determined from approximate formula (6), and the constants $I_{dc}$, $I_{pp}$ and γ of the envelope are obtained from the extreme values $I_1$, $I_2$ and $I_3$ of the interference light intensity. The constants thus obtained are determined as the constants $I_{dc}$, $I_{pp}$ and γ of approximate formula (6). It follows that it is possible to obtain an interference wave form having a high accuracy, compared with the technology of, for example, the least-squares method. Also, since the constants $I_{dc}$, $I_{pp}$ and $\gamma$ of an envelope are obtained from the three consecutive extreme values $I_1$, $I_2$ and $I_3$ of the interference intensity, it is possible to determine the envelope with a very small amount of data. It follows that it is possible to obtain the etching depth on the real time basis in a short time, making the method of the present invention excellent in the response capability to time. What should also be noted is that, in calculating the etching depth, the phase p(t) of the interference wave form is obtained by using formula (8) on the basis of approximate formula (6), in which:the constants $I_{dc}$, $I_{pp}$ and $\gamma$ have been determined, and the extreme values $I_1$, $I_2$ and $I_3$ of the interference light intensity. Further, the etching depth is calculated on the basis of the phase thus obtained, making it possible to obtain the etching depth in a short time from a very small amount of data.

As described above, in this embodiment, three consecutive maximal and minimal values of the interference wave form of the interference light beam $L_1$ are detected as extreme values $I_1$, $I_2$ and $I_3$ in the extreme value detecting means 36A. Then, the amplitude of the subsequent wave form is estimated from approximate formula (6) on the basis of these extreme values $I_1$, $I_2$ and $I_3$ and the phase p(t) is calculated from the ratio of the interference intensity I to the amplitude at time t, i.e., a ratio $[(I(t)-I_{dc})/(I_{pp}\exp(\gamma t))]$. Since the etching depth $\delta(t)$ is calculated on the basis of the phase p(t), the etching depth can be obtained by calculating the subsequent etching rate in a short time and with a small amount of calculation, if at least three extreme values are detected.

In the second embodiment described above, the phase p(t) is obtained by using formulas p(t)=Arcsin(f(t)) and f(t)=(I(t)-$I_{dc}$)/($I_{pp}$exp($\gamma$t)), and the error $\Delta$p of the phase p(t) is as denoted by formula (9). :Therefore, an error is generated at the phase p=m$\pi$/2 (m being an odd number). It should be noted that it is possible to suppress the error noted above without fail by using a light beam having a plurality of wavelengths as in the first embodiment described previously and by using at the phase p(t), at which a single interference wave form has a distortion, the phase of the other interference wave form, thereby obtaining the etching depth with a high accuracy. In the program, an average value is obtained by weighting the etching depth $\delta$i obtained by formula (8) for each wavelength $\lambda$ with cos$^2$(p) as denoted by formula (10), as in the first embodiment. In the etching apparatus used in this case, a polychromator and a plurality of light detectors are used in place of the monochromator and the light detector shown in FIG. 9.

$$\Delta p = dp/df * \Delta f = 1/\cos(p) * \Delta f \quad (9)$$

$$\delta(t) = [\Sigma\delta(t)\cos^2(p(t))/\Sigma\cos^2(p(t))] \quad (10)$$

The embodiments described above are directed to a method of detecting an etching depth by utilizing the maximum entropy method or the Fast Fourier transform method and to a method of detecting the etching depth by estimating the change with time in the amplitude of the interference wave form. The former method is unlikely to receive influences of distortion of the interference wave form. In addition, programming can be used easily and conveniently in the former method. On the other hand, the latter method is excellent in the response capability to time and in the calculating speed. It follows that it is desirable to select these methods appropriately depending on the details of the etching or to :use these methods in combination appropriately as described in the last example. Needless to say, the present invention is not limited at all by the embodiments described above, and the present invention covers a broad range as far as the technical idea of the present invention is utilized therein.

In the embodiments described above, the technical idea of the present invention is applied to the etching of a semiconductor substrate. However, as apparent from the above description, the technical idea of the present invention can also be applied to the etching of another target object such as a layer formed on a glass substrate for an LCD.

According to one embodiment of the present invention, there is provided a method of detecting an etching depth, which permits suppressing the influence of the distortion even if there is a distortion at a predetermined phase of an interference wave form so as to detect the etching depth with a high accuracy.

According,to another embodiment of the present invention, there is provided a method of detecting an etching depth,,which permits calculating the etching depth in a short time and, thus, is excellent in the response capability to time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of detecting an etching depth of a target object, comprising the steps of:

irradiating an etching layer of the target object that is being etched in an etching section with light having at least two components differing from each other in wavelength;

detecting a plurality of interference light components differing from each other in wavelength and having intensity periodically changed by the light components reflected from an upper surface of the etching layer and a surface of the etching section;

applying a frequency analysis to these interference light components so as to obtain a frequency of each of corresponding interference wave forms in which intensity forms waveform amplitude;

calculating an etching rate corresponding to each interference wave form by using the frequency of the interference wave form; and obtaining an etching depth from the etching rate.

2. The method of detecting an etching depth according to claim 1, wherein said step of calculating the etching rate comprises:

a first process of calculating the etching rate on the basis of the frequency of each of said interference wave forms so as to obtain a calculated etching rate; and a second process of obtaining the etching rate by supplementing a deviation of the calculated etching rate based on distortion of any one of the interference wave forms with the calculated etching rate based on at least one interference wave form that is not distorted.

3. The method of detecting an etching depth according to claim 2, wherein said etching rate is obtained in said second process by obtaining a weighted average of the calculated etching rates in accordance with magnitudes of distortions of the interference wave forms.

4. The method of detecting an etching depth according to claim 3, wherein said frequency analyzing process comprises the step of calculating phases of the interference wave forms and obtaining a weighted average of the calculated etching rates in accordance with the phases of these interference wave forms.

5. The method of detecting an etching depth according to claim 1, wherein said step of irradiating light comprises irradiating the light having a wavelength such that corresponding wavelengths of a plurality of interference wave forms do not become $m\pi/2$ simultaneously, where m is an odd number.

6. A method of detecting an etching depth of a target object, comprising the steps of:

irradiating an etching layer of the target object that is being etched in an etching section with a light beam;

detecting an interference light beam having an intensity periodically changed by the light beam reflected from an upper surface of the etching layer and a surface of the etching section and having an interference wave form in which intensity forms an amplitude of the interference wave form;

determining an approximate formula of the interference light beam;

determining constants of the approximate formula from the intensity of the interference light beam; and calculating an etching depth on the basis of the approximate formula, in which the constants have been determined, and the intensity of the interference light beam.

7. The method of detecting an etching depth according to claim 6, wherein said step of determining the approximate formula comprises determining the approximate formula given below:

$$I=I_{dc}+I_{pp}\exp(\gamma t)\sin(\omega t)$$

where I represents the intensity of the interference light beam, $I_{dc}$ represents an amplitude of a DC component of the interference wave form, $I_{pp}$ represents an amplitude of an AC component of the interference wave form, $\exp(\gamma t)$ represents an attenuation rate in the amplitude of the interference wave form, $\gamma$ represents a damping rate, $\omega$ represents angular frequency of the interference wave form, and each of $I_{dc}$, $I_{pp}$ and $\gamma$ is a constant.

8. The method of detecting an etching depth according to claim 7, wherein said step of determining the approximate formula comprises:

determining an envelope of the approximate formula from the approximate formula; and determining the constants of the approximate formula by obtaining the constants of the envelope from the intensity of the interference light.

9. The method of detecting an etching depth according to claim 8, wherein the constants of said envelope are determined from three consecutive extreme values of the intensity of the interference light beam.

10. The method of detecting an etching depth according to claim 6, wherein, in said step of calculating the etching depth, phase of the interference wave form is obtained on the basis of the approximate formula, in which the constants have been determined, and the intensity of the interference light beam, and the etching depth is calculated on the basis of said phase.

11. A method of detecting an etching depth, comprising the steps of:

detecting an etching depth for each wavelength by the method defined in claim 6 by using light having a plurality of wavelengths; and calculating an average etching depth by supplementing each of said etching depths.

12. A method of detecting an etching depth of a target object, comprising the steps of:

irradiating an etching layer of the target object that is being etched in an etching section with a light beam;

detecting an interference light beam that is periodically changed with an amplitude provided by an intensity caused by a reflected light beam from an upper surface of the etching layer and from a surface of the etching section;

estimating an amplitude of a subsequent interference wave form based on a plurality of extreme values of an interference wave form having an amplitude provided by the intensity of the interference light beam;

calculating a phase on the basis of the interference intensity and amplitude at a certain time; and calculating an etching depth on the basis of the calculated phase.

13. A method of detecting an etching depth, comprising the steps of:

continuously etching an etching section of an etching layer;

measuring an etching depth of the etching section on a real time basis so as to output a corresponding information;

comparing the output information with an information corresponding to an etching depth set in advance on the real time basis; and stopping the step of etching when the output information has been found in the comparing step to be equal to the information corresponding to the etching depth set in advance.

* * * * *